(12) United States Patent
Chiang et al.

(10) Patent No.: US 8,865,517 B2
(45) Date of Patent: Oct. 21, 2014

(54) METHOD FOR MANUFACTURING THIN-FILM TRANSISTOR ACTIVE DEVICE AND THIN-FILM TRANSISTOR ACTIVE DEVICE MANUFACTURED WITH SAME

(71) Applicant: Shenzhen China Star Optoelectronics Technology Co., Ltd., Shenzhen (CN)

(72) Inventors: Chenglung Chiang, Shenzhen (CN); Polin Chen, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 102 days.

(21) Appl. No.: 13/806,740

(22) PCT Filed: Oct. 12, 2012

(86) PCT No.: PCT/CN2012/082817
§ 371 (c)(1),
(2), (4) Date: Dec. 21, 2012

(87) PCT Pub. No.: WO2014/047980
PCT Pub. Date: Apr. 3, 2014

(65) Prior Publication Data
US 2014/0084285 A1   Mar. 27, 2014

(30) Foreign Application Priority Data
Sep. 26, 2012   (CN) .......................... 2012 1 0363720

(51) Int. Cl.
*H01L 21/16*   (2006.01)
*H01L 29/66*   (2006.01)
*H01L 27/12*   (2006.01)
*H01L 29/786*   (2006.01)

(52) U.S. Cl.
CPC ...... *H01L 29/66969* (2013.01); *H01L 27/1248* (2013.01); *H01L 27/1225* (2013.01); *H01L 29/7869* (2013.01); *H01L 27/127* (2013.01); *H01L 27/124* (2013.01)
USPC .............. 438/104; 438/149; 438/153; 257/43

(58) Field of Classification Search
CPC ...................... H01L 29/66969; H01L 29/7869
USPC .............................. 438/104, 149, 153; 257/43
See application file for complete search history.

(56) References Cited

U.S. PATENT DOCUMENTS 8,174,013 B2 * 5/2012 Moriguchi et al. ............. 257/59
8,426,859 B2 * 4/2013 Kakinuma ...................... 257/57

* cited by examiner

*Primary Examiner* — Theresa T Doan
(74) *Attorney, Agent, or Firm* — Cheng-Ju Chiang

(57) ABSTRACT

The present invention provides a method for manufacturing thin-film transistor active device and a thin-film transistor active device manufactured with the method. The method includes providing a substrate; forming a gate terminal on the substrate through sputtering and masking operations; forming a gate insulation layer on the gate terminal through CVD; forming an oxide semiconductor layer on the gate insulation layer through sputtering and masking operations; forming a first protection layer on the oxide semiconductor layer through CVD, forming a metal layer on the first protection layer through sputtering, and forming a data line electrode through masking operation; forming a second protection layer on the first protection layer and the data line electrode through CVD and forming first, second, and third bridging holes through masking operation; forming a transparent conductive layer on the second protection layer through sputtering and patternizing the transparent conductive layer through masking operation.

8 Claims, 6 Drawing Sheets

METHOD FOR MANUFACTURING THIN-FILM TRANSISTOR ACTIVE DEVICE AND THIN-FILM TRANSISTOR ACTIVE DEVICE MANUFACTURED WITH SAME

BACKGROUND OF THE INVENTION

1. Field of the Invention

The present invention relates to the technical field of flat panel display device, and in particular to a method for manufacturing thin-film transistor (TFT) active device and the TFT active device manufactured with the method.

2. The Related Arts

An active matrix flat panel display device has numerous advantages, such as thin device body, less power consumption, and being free of radiation, and is thus widely used. Most of the flat panel display devices available in the market are backlighting liquid crystal displays, which comprise a liquid crystal display panel and a backlight module. The operation principle of the liquid crystal display panel is that liquid crystal molecules are arranged between two parallel glass substrates and electricity is selectively applied to the glass substrates to cause change of the orientation of the liquid crystal molecules in order to refract out the light from a backlight module for formation of an image.

A liquid crystal display panel is composed of a color filter (CF) substrate, a thin-film transistor (TFT) substrate, liquid crystal (LC) interposed between the CF substrate and the TFT substrate, and a sealant. A general manufacturing process comprises a front stage of array process (including thin film, yellow light, etching, and film stripping), an intermediate stage of cell process (including bonding TFT substrate and the CF substrate), and a rear stage of assembling process (including mounting drive ICs and printed circuit board). The front stage of array process generally makes the TFT substrate for controlling the movement of liquid crystal molecules. The intermediate stage of cell process generally introduces liquid crystal between the TFT substrate and the CF substrate. The rear stage of assembling process generally mounts the drive ICs and combining the printed circuit board to effect driving the liquid crystal molecules to rotate for displaying images.

The TFT substrate generally comprises a glass substrate and TFTs formed on the glass substrate. The TFTs are subjected to at least six masking processes before they can be formed on the glass substrate.

Referring to FIGS. 1A-1F, a flow of a conventional manufacture process of a TFT is illustrated. IGZO is an abbreviation standing for indium gallium zinc oxide, which is a technique of oxide thin-film transistor comprising forming a metal oxide active layer on a gate insulation layer of the TFT, this being a TFT driving technique. According to the flow of manufacturing process illustrated in FIGS. 1A-1F, a gate electrode (GE) 101 is first formed on a substrate 100. Next, a gate insulation (GI) layer 102 is formed to cover the gate electrode 101. Then, an oxide semiconductor layer, which is specifically an IGZO layer 103, is formed on the gate insulation layer 101. Then, a first protection layer (an ES layer) 104 is formed on IGZO layer 103. The ES layer is often formed through chemical vapor deposition (CVD) of a precursor substance. Afterwards, a source terminal 105 and a drain terminal 106 are formed of a sputtered metal layer. In addition to the source terminal 105 and the drain terminal 106, the metal layer also serves as wiring lay-out material connecting to the IGZO layer 103. A conventional manufacturing process is to deposit the metal on the IGZO layer 103 and subjects the metal to etching to form the source terminal 105 and the drain terminal 106. The metal used can be copper (Cu), Aluminum (Al), Molybdenum (Mo), titanium (Ti), or a laminated structure thereof. Then, a second protection layer (a PV layer) 107 is formed to cover the source terminal 105 and the drain terminal 106 and is subjected to etching to form a channel. Finally, an indium tin oxide (ITO) layer 108 is formed. To this point, a TFT active device that is generally composed of a gate electrode 101, a gate insulation layer 102, an IGZO layer 103, a first protection layer 104, a source terminal 105, a drain terminal 106, a second protection layer 107, and an ITO layer 108 is formed.

SUMMARY OF THE INVENTION

An object of the present invention is to provide a method for manufacturing thin-film transistor active device, which effectively simplifies the process of manufacturing and lowers down the cost of manufacturing.

Another object of the present invention is to provide a thin-film transistor active device, which has a simple manufacturing process and low cost.

To achieve the objective, the present invention provides a method for manufacturing thin-film transistor active device, which comprises the following steps:

(1) providing a substrate;

(2) forming a gate terminal on the substrate through sputtering and masking operations;

(3) forming a gate insulation layer on the gate terminal through chemical vapor deposition;

(4) forming an oxide semiconductor layer on the gate insulation layer through sputtering and masking operations;

(5) forming a first protection layer on the oxide semiconductor layer through chemical vapor deposition, forming a metal layer on the first protection layer through a sputtering operation, and forming a data line electrode through a masking operation;

(6) forming a second protection layer on the first protection layer and the data line electrode through chemical vapor deposition and forming first, second, and third bridging holes through a masking operation, the first bridging hole being located on the data line electrode, the second and third bridging holes being located on two ends of the oxide semiconductor layer; and (7) forming a transparent conductive layer on the second protection layer through sputtering and patternizing the transparent conductive layer through a masking operation, the transparent conductive layer having a portion electrically connecting the data line electrode and the oxide semiconductor layer via the first and second bridging holes and another portion electrically connecting the oxide semiconductor layer via the third bridging hole to form a pixel electrode, thereby forming a thin-film transistor active device.

The substrate comprises a glass or plastic substrate.

The gate terminal is formed of copper, aluminum, molybdenum, titanium, or a laminated structure thereof through sputtering and masking operations.

The gate insulation layer comprises silicon oxide or silicon nitride layer.

The oxide semiconductor layer comprises at least one of zinc oxide, tin oxide, indium oxide, and gallium oxide.

The metal layer is formed of copper, aluminum, molybdenum, titanium, or a laminated structure thereof through sputtering.

The transparent conductive layer comprises one of an indium tin oxide layer, an indium zinc oxide layer, an aluminum zinc oxide layer, and a gallium zinc oxide or a lamination thereof.

The present invention also provides a method for manufacturing thin-film transistor active device, which comprises the following steps:

(1) providing a substrate;

(2) forming a gate terminal on the substrate through sputtering and masking operations;

(3) forming a gate insulation layer on the gate terminal through chemical vapor deposition;

(4) forming an oxide semiconductor layer on the gate insulation layer through sputtering and masking operations;

(5) forming a first protection layer on the oxide semiconductor layer through chemical vapor deposition, forming a metal layer on the first protection layer through a sputtering operation, and forming a data line electrode through a masking operation;

(6) forming a second protection layer on the first protection layer and the data line electrode through chemical vapor deposition and forming first, second, and third bridging holes through a masking operation, the first bridging hole being located on the data line electrode, the second and third bridging holes being located on two ends of the oxide semiconductor layer; and (7) forming a transparent conductive layer on the second protection layer through sputtering and patternizing the transparent conductive layer through a masking operation, the transparent conductive layer having a portion electrically connecting the data line electrode and the oxide semiconductor layer via the first and second bridging holes and another portion electrically connecting the oxide semiconductor layer via the third bridging hole to form a pixel electrode, thereby forming a thin-film transistor active device; and wherein the substrate comprises a glass or plastic substrate;

wherein the gate terminal is formed of copper, aluminum, molybdenum, titanium, or a laminated structure thereof through sputtering and masking operations;

wherein the gate insulation layer comprises silicon oxide or silicon nitride layer;

wherein the oxide semiconductor layer comprises at least one of zinc oxide, tin oxide, indium oxide, and gallium oxide;

wherein the metal layer is formed of copper, aluminum, molybdenum, titanium, or a laminated structure thereof through sputtering; and wherein the transparent conductive layer comprises one of an indium tin oxide layer, an indium zinc oxide layer, an aluminum zinc oxide layer, and a gallium zinc oxide or a lamination thereof.

The present invention further provides a thin-film transistor active device, which comprises a substrate, a gate terminal formed on the substrate, a gate insulation layer formed on the gate terminal, an oxide semiconductor layer formed on the gate insulation layer, a first protection layer formed on the oxide semiconductor layer, a data line electrode formed on the first protection layer, a second protection layer formed on the first protection layer and the data line electrode, and a transparent conductive layer formed on the second protection layer. The second protection layer forms first, second, and third bridging holes. The first bridging hole is located on the data line electrode. The second and third bridging holes are located on two ends of the oxide semiconductor layer. The transparent conductive layer has a portion electrically connecting the data line electrode and the oxide semiconductor layer via the first and second bridging holes and another portion electrically connecting the oxide semiconductor layer via the third bridging hole so as to form a pixel electrode.

The oxide semiconductor layer comprises at least one of zinc oxide, tin oxide, indium oxide, and gallium oxide.

The transparent conductive layer comprises one of an indium tin oxide layer, an indium zinc oxide layer, an aluminum zinc oxide layer, and a gallium zinc oxide or a lamination thereof.

The efficacy of the present invention is that the present invention provides a method for manufacturing thin-film transistor active device and a thin-film transistor active device manufactured with the method, wherein a first bridging hole is formed on a data line electrode and second and third bridging holes are formed on an oxide semiconductor layer to allow a portion of a transparent conductive layer to electrically connect the data line electrode and the oxide semiconductor layer, another portion of the transparent conductive layer electrically connecting with the oxide semiconductor layer via the third bridging hole so as to form a pixel electrode, whereby one masking operation is omitted so as to simplify the manufacturing process of liquid crystal display panel and lower down the manufacturing cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1A:
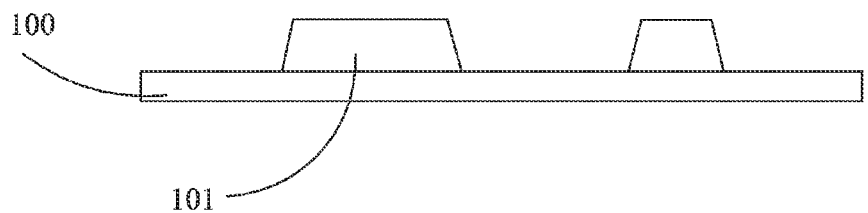
FIGS. 1A-1F illustrate a flow for manufacturing a thin-film transistor (TFT) with a conventional manufacture process that comprises six masking operations.
Figure 1B:
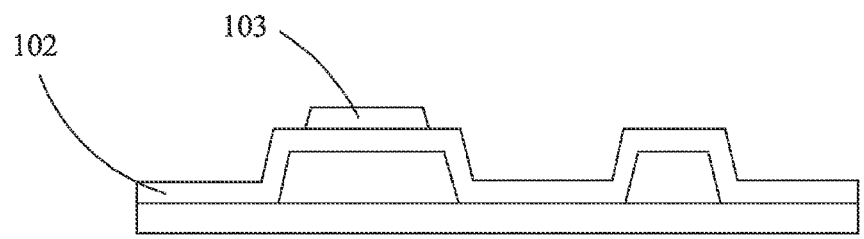
Figure 1C:
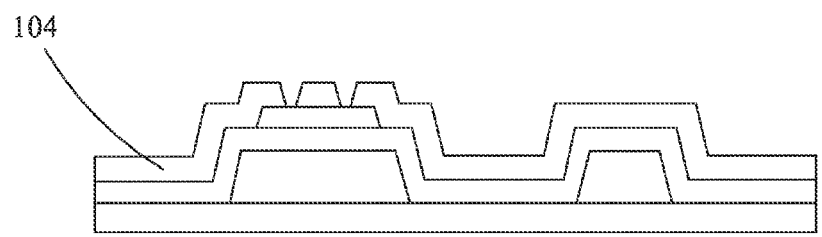
Figure 1D:
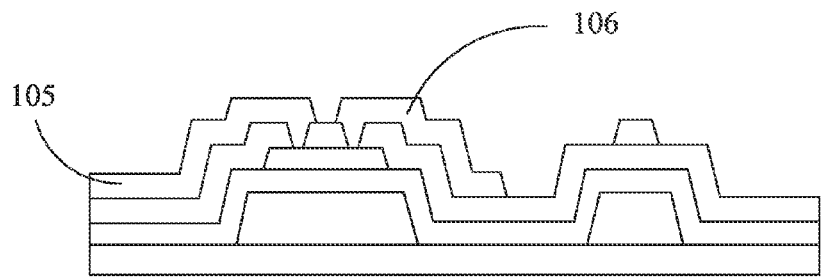
Figure 1E:
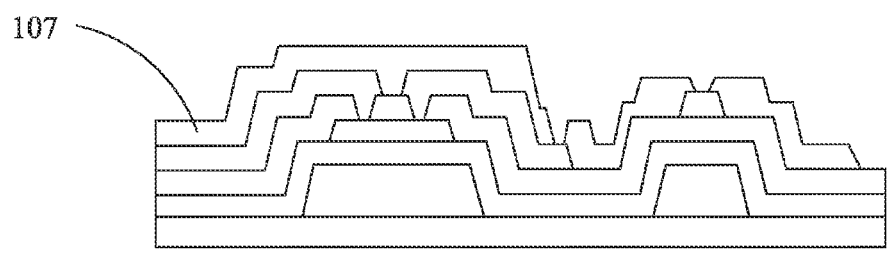
Figure 1F:
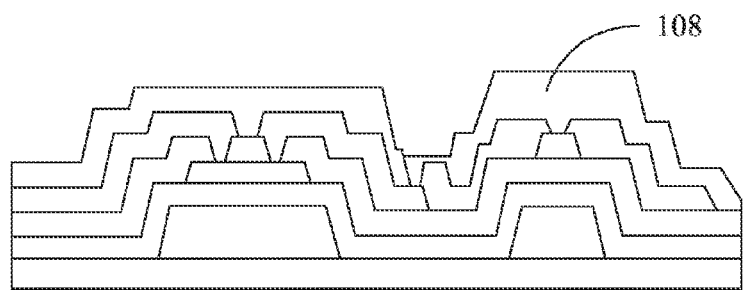
Figure 2:
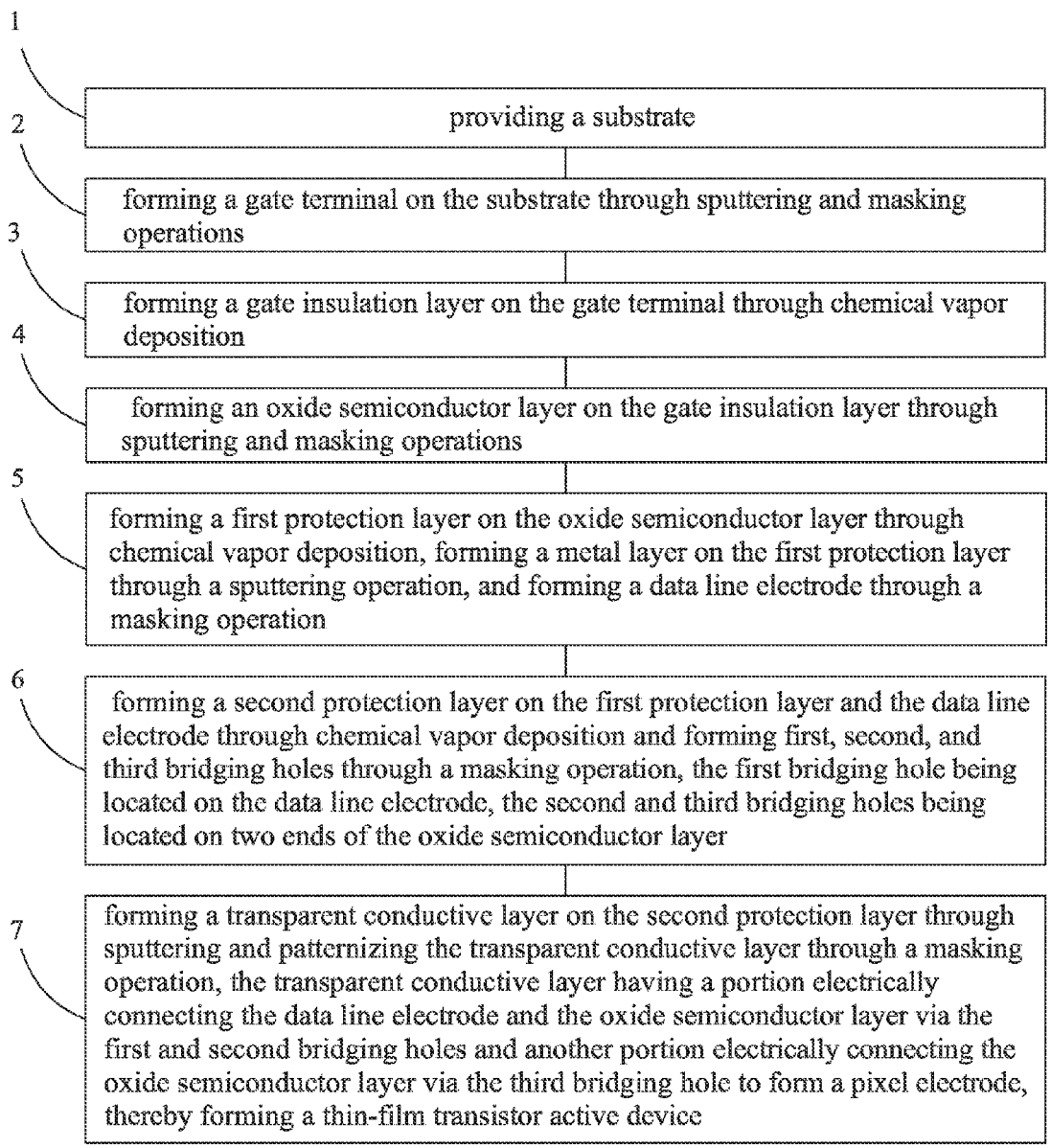
FIG. 2 is a flow chart illustrating a method for manufacturing a thin-film transistor active device according to the present invention.
Figure 3A:
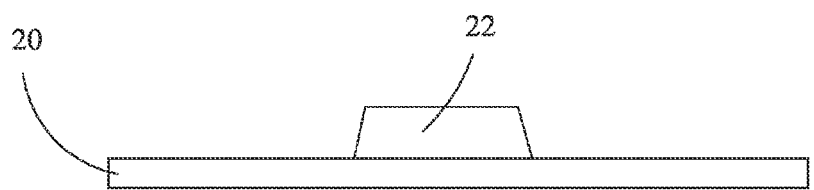
FIGS. 3A-3E illustrate a flow of the manufacturing method of a thin-film transistor active device according to the present invention.
Figure 3B:
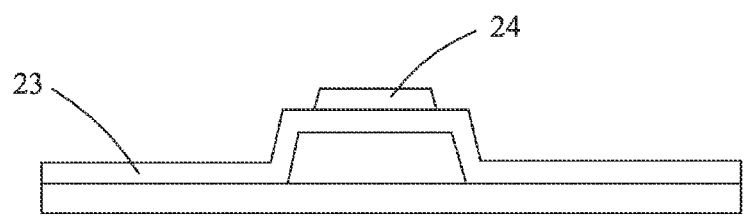
Figure 3C:
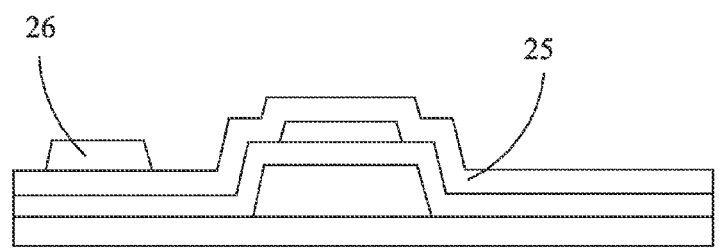
Figure 3D:
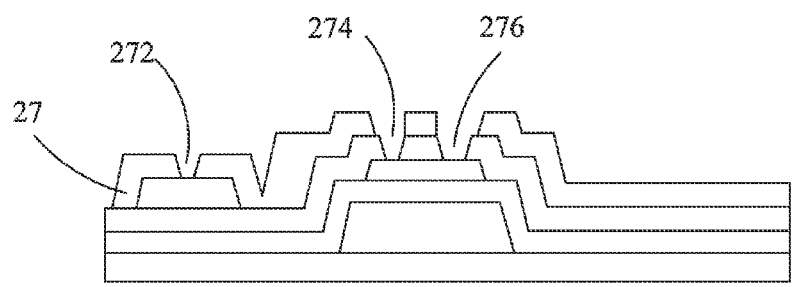
Figure 3E:
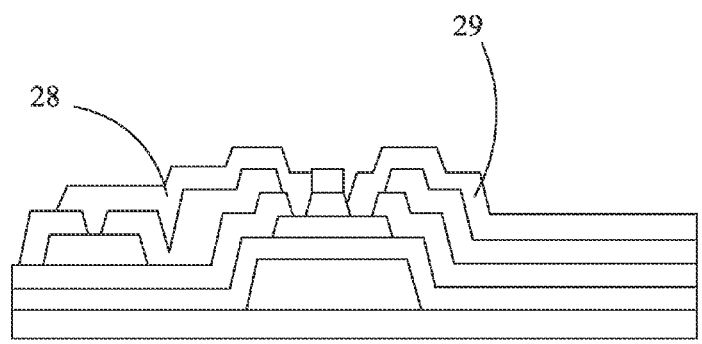
Figure 4:
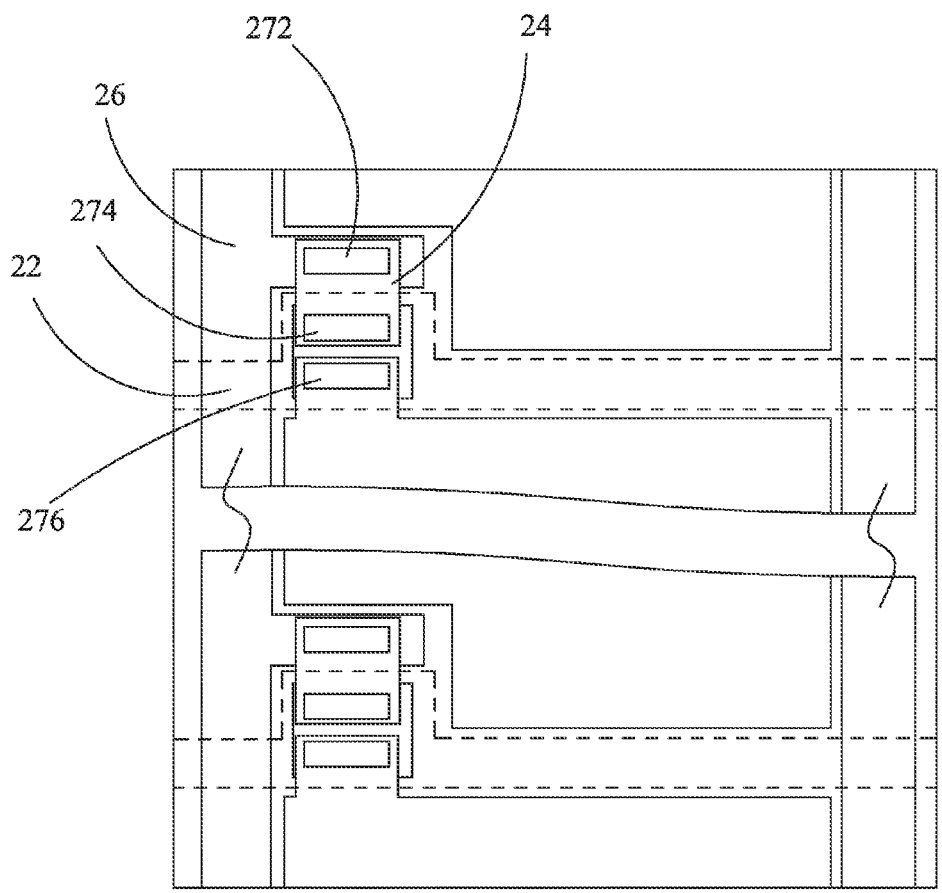
FIG. 4 is top plan view of FIG. 3E.

Referring to FIGS. 2-4, the present invention provides a manufacturing method of thin-film transistor active device, which comprises the following steps:

Step 1: providing a substrate 20.

The substrate 20 is a transparent substrate, preferably a glass or plastic substrate.

Step 2: forming a gate terminal 22 on the first substrate 20 through sputtering and masking operations.

The gate terminal 22 is formed of copper (Cu), aluminum (Al), molybdenum (Mo), titanium (Ti), or a laminated structure thereof through sputtering and masking operations, wherein the masking operation comprises operations of coating of photo-resist, exposure, development, and etching.

Step 3: forming a gate insulation layer (GI layer) 23 on the gate terminal 22 through chemical vapor deposition.

The gate insulation layer 23 is a silicon oxide ($SiO_x$) or silicon nitride ($SiN_x$) layer, which is formed on the gate terminal 22 through chemical vapor deposition.

Step 4: forming an oxide semiconductor layer 24 on the gate insulation layer 23 through sputtering and masking operations.

The oxide semiconductor layer 24 comprises at least one of zinc oxide ($ZnO_x$), tin oxide ($SnO_x$), indium oxide ($InO_x$), and gallium oxide ($GaO_x$).

Step 5: forming a first protection layer 25 on the oxide semiconductor layer 24 through chemical vapor deposition, forming a metal layer on the first protection layer 25 through a sputtering operation, and forming a data line electrode 26 through a masking operation.

The metal layer is formed of copper (Cu), aluminum (Al), molybdenum (Mo), titanium (Ti), or a laminated structure thereof on the first protection layer 25 through sputtering and is subjected to a masking operation to form the data line electrode 26.

Step 6: forming a second protection layer 27 on the first protection layer 25 and the data line electrode 26 through chemical vapor deposition and forming first, second, and third bridging holes 272, 274, 276 through a masking operation, the first bridging hole 272 being located on the data line electrode 26, the second and third bridging holes 274, 276 being located on two ends of the oxide semiconductor layer 24.

Step 7: forming a transparent conductive layer 28 on the second protection layer 27 through sputtering and patternizing the transparent conductive layer 28 through a masking operation, the transparent conductive layer 28 having a portion electrically connecting the data line electrode 26 and the oxide semiconductor layer 24 via the first and second bridging holes 272, 274 and another portion electrically connecting the oxide semiconductor layer 24 via the third bridging hole 276 to form a pixel electrode 29, thereby forming a thin-film transistor active device.

The transparent conductive layer 28 is one of an indium tin oxide (ITO) layer, an indium zinc oxide (IZO) layer, an aluminum zinc oxide (AZO) layer, and a gallium zinc oxide (GZO) layer or a lamination thereof.

Referring to FIGS. 3A-4, the present invention also provides a thin-film transistor active device, which comprises a substrate 20, a gate terminal 22 formed on the substrate 20, a gate insulation layer 23 formed on the gate terminal 22, an oxide semiconductor layer 24 formed on the gate insulation layer 23, a first protection layer 25 formed on the oxide semiconductor layer 24, a data line electrode 26 formed on the first protection layer 25, a second protection layer 27 formed on the first protection layer 25 and the data line electrode 26, and a transparent conductive layer 28 formed on the second protection layer 27. The second protection layer 27 forms first, second, and third bridging holes 272, 274, 276. The first bridging hole 272 is located on the data line electrode 26 and the second and third bridging holes 274, 276 are located on two ends of the oxide semiconductor layer 24. The transparent conductive layer 28 has a portion electrically connecting the data line electrode 26 and the oxide semiconductor layer 24 via the first and second bridging holes 272, 274 and another portion electrically connecting the oxide semiconductor layer 24 via the third bridging hole 276 so as to form a pixel electrode 29.

The oxide semiconductor layer 24 comprises at least one of zinc oxide ($ZnO_x$), tin oxide ($SnO_x$), indium oxide ($InO_x$), and gallium oxide ($GaO_x$).

The transparent conductive layer 28 is one of an indium tin oxide (ITO) layer, an indium zinc oxide (IZO) layer, an aluminum zinc oxide (AZO) layer, and a gallium zinc oxide (GZO) layer or a lamination thereof.

In summary, the present invention provides a method for manufacturing thin-film transistor active device and a thin-film transistor active device manufactured with the method, wherein a first bridging hole is formed on a data line electrode and second and third bridging holes are formed on an oxide semiconductor layer to allow a portion of a transparent conductive layer to electrically connect the data line electrode and the oxide semiconductor layer, another portion of the transparent conductive layer electrically connecting with the oxide semiconductor layer via the third bridging hole so as to form a pixel electrode, whereby one masking operation is omitted so as to simplify the manufacturing process of liquid crystal display panel and lower down the manufacturing cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor active device, comprising the following steps:
   (1) providing a substrate;
   (2) forming a gate terminal on the substrate through sputtering and masking operations;
   (3) forming a gate insulation layer on the gate terminal through chemical vapor deposition;
   (4) forming an oxide semiconductor layer on the gate insulation layer through sputtering and masking operations;
   (5) forming a first protection layer on the oxide semiconductor layer through chemical vapor deposition, forming a metal layer on the first protection layer through a sputtering operation, and forming a data line electrode through a masking operation;
   (6) forming a second protection layer on the first protection layer and the data line electrode through chemical vapor deposition and forming first, second, and third bridging holes through a masking operation, the first bridging hole being located on the data line electrode, the second and third bridging holes being located on two ends of the oxide semiconductor layer; and
   (7) forming a transparent conductive layer on the second protection layer through sputtering and patternizing the transparent conductive layer through a masking operation, the transparent conductive layer having a portion electrically connecting the data line electrode and the oxide semiconductor layer via the first and second bridging holes and another portion electrically connecting the oxide semiconductor layer via the third bridging hole to form a pixel electrode, thereby forming a thin-film transistor active device.

2. The method for manufacturing a thin-film transistor active device as claimed in claim 1, wherein the substrate comprises a glass or plastic substrate.

3. The method for manufacturing a thin-film transistor active device as claimed in claim 1, wherein the gate terminal is formed of copper, aluminum, molybdenum, titanium, or a laminated structure thereof through sputtering and masking operations.

4. The method for manufacturing a thin-film transistor active device as claimed in claim 1, wherein the gate insulation layer comprises silicon oxide or silicon nitride layer.

5. The method for manufacturing a thin-film transistor active device as claimed in claim 1, wherein the oxide semiconductor layer comprises at least one of zinc oxide, tin oxide, indium oxide, and gallium oxide.

6. The method for manufacturing a thin-film transistor active device as claimed in claim 1, wherein the metal layer is formed of copper, aluminum, molybdenum, titanium, or a laminated structure thereof through sputtering.

7. The method for manufacturing a thin-film transistor active device as claimed in claim 1, wherein the transparent conductive layer comprises one of an indium tin oxide layer, an indium zinc oxide layer, an aluminum zinc oxide layer, and a gallium zinc oxide or a lamination thereof.

8. A method for manufacturing a thin-film transistor active device, comprising the following steps:
  (1) providing a substrate;
  (2) forming a gate terminal on the substrate through sputtering and masking operations;
  (3) forming a gate insulation layer on the gate terminal through chemical vapor deposition;
  (4) forming an oxide semiconductor layer on the gate insulation layer through sputtering and masking operations;
  (5) forming a first protection layer on the oxide semiconductor layer through chemical vapor deposition, forming a metal layer on the first protection layer through a sputtering operation, and forming a data line electrode through a masking operation;
  (6) forming a second protection layer on the first protection layer and the data line electrode through chemical vapor deposition and forming first, second, and third bridging holes through a masking operation, the first bridging hole being located on the data line electrode, the second and third bridging holes being located on two ends of the oxide semiconductor layer; and
  (7) forming a transparent conductive layer on the second protection layer through sputtering and patternizing the transparent conductive layer through a masking operation, the transparent conductive layer having a portion electrically connecting the data line electrode and the oxide semiconductor layer via the first and second bridging holes and another portion electrically connecting the oxide semiconductor layer via the third bridging hole to form a pixel electrode, thereby forming a thin-film transistor active device;

wherein the substrate comprises a glass or plastic substrate;

wherein the gate terminal is formed of copper, aluminum, molybdenum, titanium, or a laminated structure thereof through sputtering and masking operations;

wherein the gate insulation layer comprises silicon oxide or silicon nitride layer;

wherein the oxide semiconductor layer comprises at least one of zinc oxide, tin oxide, indium oxide, and gallium oxide;

wherein the metal layer is formed of copper, aluminum, molybdenum, titanium, or a laminated structure thereof through sputtering; and wherein the transparent conductive layer comprises one of an indium tin oxide layer, an indium zinc oxide layer, an aluminum zinc oxide layer, and a gallium zinc oxide or a lamination thereof.

\* \* \* \* \*